United States Patent [19]

Hidaka et al.

[11] Patent Number: 4,890,261

[45] Date of Patent: Dec. 26, 1989

[54] VARIABLE WORD LENGTH CIRCUIT OF SEMICONDUCTOR MEMORY

[75] Inventors: Hideto Hidaka; Kazuyasu Fujishima; Yoshio Matsuda, all of Hyogo, Japan

[73] Assignee: Mitsubishi Denki Kabushiki Kaisha, Tokyo, Japan

[21] Appl. No.: 206,417

[22] Filed: Jun. 14, 1988

[30] Foreign Application Priority Data

Jun. 16, 1987 [JP] Japan .................................. 62-149551

[51] Int. Cl.[4] ...................... G11C 21/00; G11C 19/00; G11C 8/00
[52] U.S. Cl. ................................. 365/73; 365/189.12; 365/240; 365/75; 365/78
[58] Field of Search .................. 365/230, 189, 240, 73, 365/78, 75, 76, 77, 230.01, 189.12

[56] References Cited

U.S. PATENT DOCUMENTS

| | | | |
|---|---|---|---|
| 4,429,375 | 1/1984 | Kobayashi et al. | 365/240 |
| 4,648,077 | 5/1987 | Pinkham et al. | 365/240 |
| 4,677,594 | 6/1987 | Bisotto et al. | 365/240 |
| 4,796,225 | 1/1989 | Benkara et al. | 365/75 |

*Primary Examiner*—Stuart N. Hecker
*Assistant Examiner*—Melissa J. Koval
*Attorney, Agent, or Firm*—Lowe, Price, LeBlanc, Becker & Shur

[57] ABSTRACT

A word length variable circuit of a semiconductor memory comprises a shift register provided corresponding to rows or columns of a memory cell array. The input of the first stage of the shift register is connected to the output of the last stage and regions of the shift register is grouped to form a fixed recirculation path. The word length can be varied by modifying stored data in the shift register without changing its recirculation path.

9 Claims, 7 Drawing Sheets

VARIABLE WORD LENGTH CIRCUIT OF SEMICONDUCTOR MEMORY

BACKGROUND OF THE INVENTION

1. Field of the Invention

The present invention relates to a variable word length circuit of a semiconductor memory and, more particularly, to a variable word length circuit of a semiconductor memory capable of varying a word length of data accessed serially by a shift register in a semiconductor memory in which a plurality of memory cells are arranged in row and column directions and the shift register is provided corresponding to a memory cells on a row or a column.

2. Description of the Prior Art

As conventional access methods for a semiconductor memory cell, a random access method and a serial access method have been employed. In the serial access method, a shift register is provided in a data input/output portion and a certain length of bits (hereinafter referred to as a word) is inputted and outputted serially at high speed, which is advantageous particularly in a case of transferring (inputting and outputting to a memory cell array) a data group of a certain block at high speed.

Figure 1:
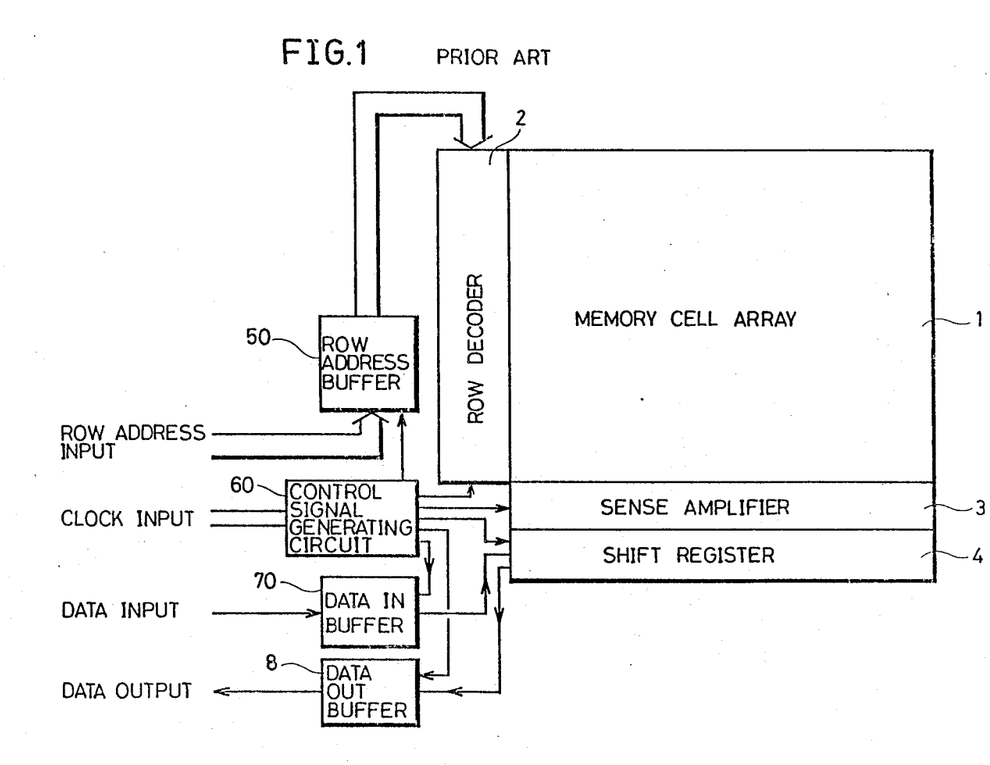
FIG. 1 is a schematic block diagram showing a conventional semiconductor memory provided with a serial access method.

FIG. 1 is a schematic block diagram showing a semiconductor memory provided with the serial access method. Although a dynamic MOSRAM is employed as a memory cell array in the semiconductor memory shown in FIG. 1, the following description is not limited to this.

The dynamic MOSRAM comprises a memory cell array 1, a row decoder 2, a sense amplifier 3, a shift register 4, a row address buffer 50, a control signal generating circuit 60, a data-in buffer 70 and a data-out buffer 8. The memory cell array 1 comprises, though not shown in the figure, a plurality of word lines, a plurality of bit lines crossing at right angles therewith and a group of memory cells each disposed on an intersecting point of both lines. The row decoder 2 selects a corresponding word line in response to a row address signal inputted from the outside to the row address buffer 50. When any word lines is selected, data stored in a memory cell group for a selected one row appear as a signal potential on a bit line. This signal potential is detected and amplified by the sense amplifier 3.

Each memory cell group is constructed by one-transistor one-capacitor type and the sense amplifier 3 is also designed to perform refreshing operation of data of each memory cell group. In addition, the sense amplifier 3 serves as a data latch and is connected to the shift register 4 at each bit line. The data-in buffer 70 and the data-out buffer 8 are connected to the shift register 4 and the data-in buffer 70 applies the data inputted from the outside to the shift register 4. When the data is read, the data detected and amplified by the sense amplifier 3 is applied to the shift register 4, which data is serially selected in accordance with the shift operation of the shift register 4 and outputted to the data-out buffer 8.

When data is written, data to be written sent from the data-in buffer 70 is serially shifted by the shift register 4 and written to the corresponding memory cell from a bit line through the corresponding sense amplifier 3.

Figure 2:
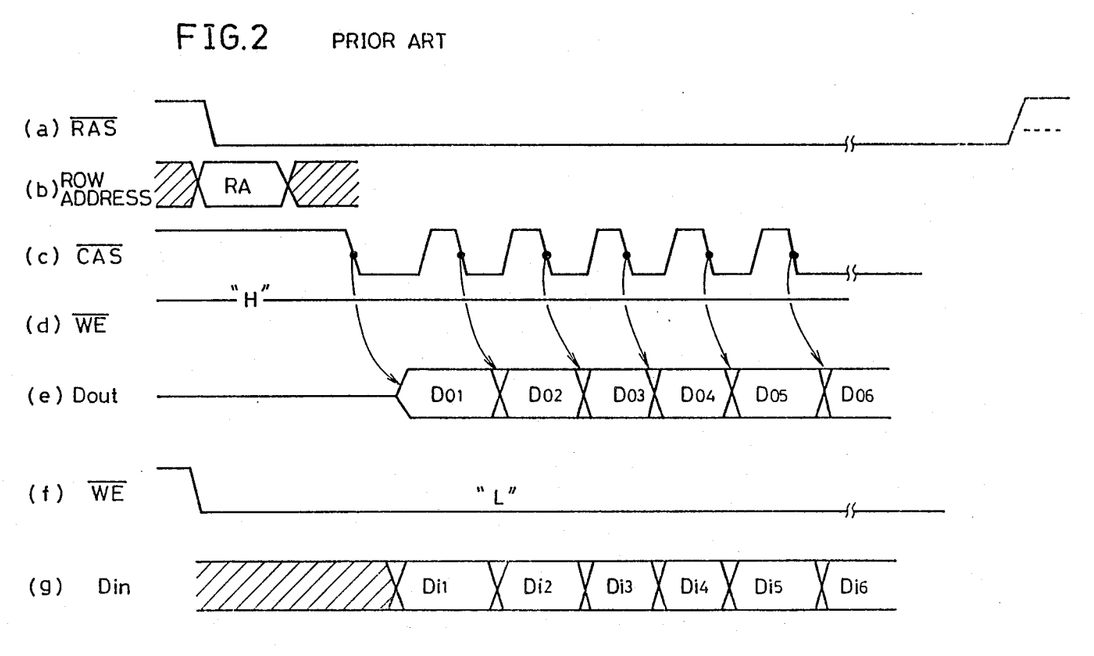
FIG. 2 is a timing diagram for explaining the operation of the dynamic MOSRAM shown in FIG. 1.

FIG. 2 is a waveform diagram for explaining the operation of the dynamic MOSRAM shown in FIG. 1. When an external control signal $\overline{RAS}$ applied to the control signal generating circuit 60 falls as shown in FIG. 2, the row address buffer 50 latches an external row address signal applied from the outside. In FIG. 2, row address signals for a plurality of bits are represented by "RA". When a row address signal is latched by the row address buffer 50, the row decoder 2 selects and activates the corresponding word line and the data of a plurality of bits of memory cells selected in the memory cell array 1 are amplified and latched by the sense amplifier 3.

When data is read, at every cycle in which an external control signal $\overline{CAS}$ falls as shown in FIG. 2, data is serially selected by the shift register 4 as shown in FIG. 2 and latched by the data-out buffer 8 to be then outputted. On the other hand, when data is written, at every cycle in which the external control signal $\overline{CAS}$ falls, the data which has been latched by the data-in buffer 70 is written in a memory cell.

Figure 3A:
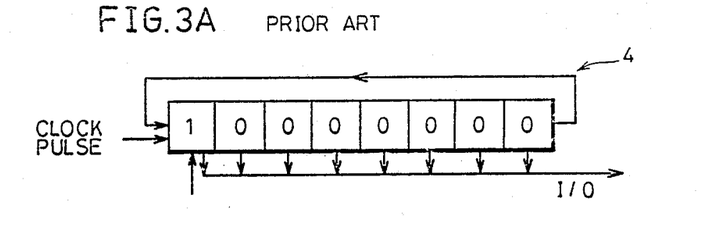
FIGS. 3A to 3C are conceptual diagrams for explaining the shift register shown in FIG. 2.
Figure 3B:
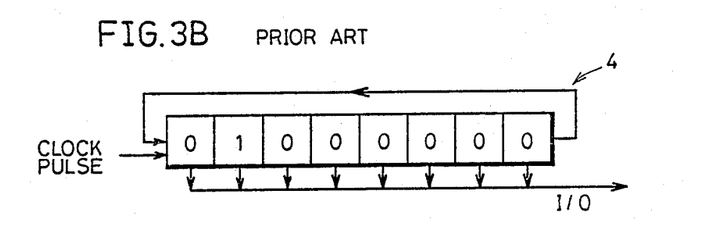
Figure 3C:
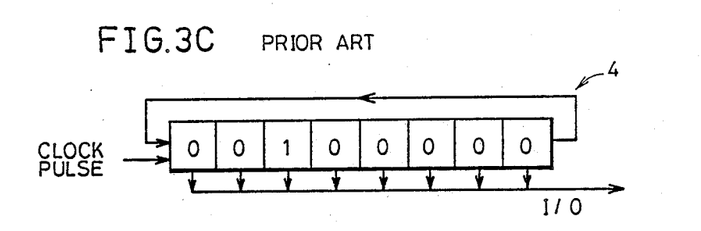

FIGS. 3A to 3C are conceptual diagrams for explaining the operation of the shift register shown in FIG. 2. In FIGS. 3A to 3C, as one example, data of 8 bits is shown as being serially written and read. First, the first bit of the shift register 4 of 8 bits is initialized to "1" and other bits are all initialized to "0". Thereafter, as the shift register 4 is shifted by one bit at every cycle of the external control signal $\overline{CAS}$, a bit line pair corresponding to the data "1" of the shift register 4 is successively connected to a data input/output line "I/O line" and input/output operation of data is performed. Thus, when the shift operation is performed eight times, the first bit of the shift register 4 is set to "1" again and other bits are set to "0", and thereafter, the same operation will be repeated.

In the dynamic MOSRAM shown in the above-described FIG. 1, the number of bits of one group (hereinafter referred to as a word length), which is serially accessed is the same as that of memory cells selected by one word line. In effect, however, this fact limits the application of the memory cell. Therefore, there was a disadvantage that the word length could not be changed by a simple method after production.

SUMMARY OF THE INVENTION

It is, therefore, a primary object of the present invention to provide a variable word length circuit of a semiconductor memory device in which a word length can be varied by a simple method.

Briefly, a variable word length circuit of a semiconductor memory in accordance with the present invention for varying a word length of a memory cell array in which a plurality of memory cells are arranged in row and column directions comprises: a shift register corresponding to the rows or columns of the memory cell array, the input of the first stage of which being connected to the output of the last stage to form a fixed recirculation path, wherein word length is varied by changing the data stored in the shift register without charging the recirculation path of the register.

Therefore, according to the present invention, a word length of a serial access memory can be arbitrarily varied by switching initialized data of the shift register to switch the cycle of circulation, whereby the serial access memory which is widely applicable can be brought about.

In a preferred embodiment of the present invention, a shift register comprises data input terminals provided corresponding to the respective regions and switching devices provided applying initialized data to each region commonly or applying initialized data to each group formed of regions.

Furthermore, in the preferred embodiment of the present invention, the shift register comprises data output terminals corresponding to respective regions and output switching means for switching so as to output data outputted from each region for every group or output the same together.

A method of varying word length of the memory, in accordance with another aspect of the invention, comprises changing data stored in the stage of the shift register to correspond to a predetermined word length, and recirculating data in the shift register along a fixed recirculation path.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
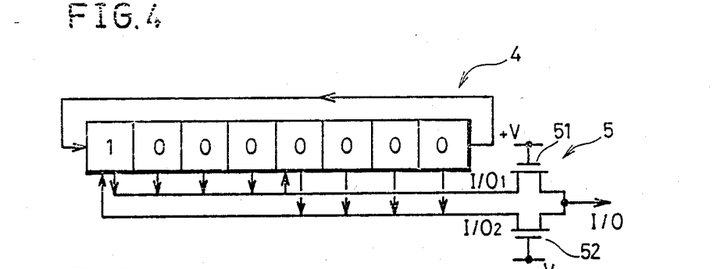
FIGS. 4 and 5 are block diagrams showing a shift register of an embodiment in accordance with the present invention.
Figure 5:
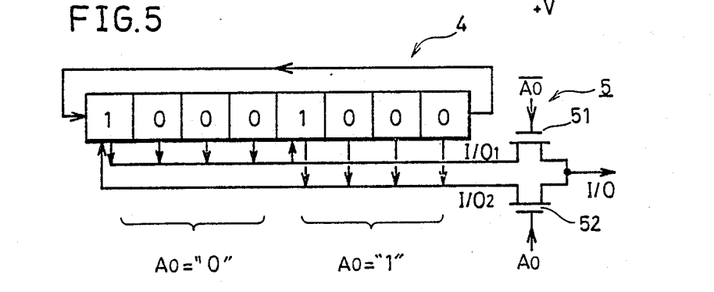
Figure 6:
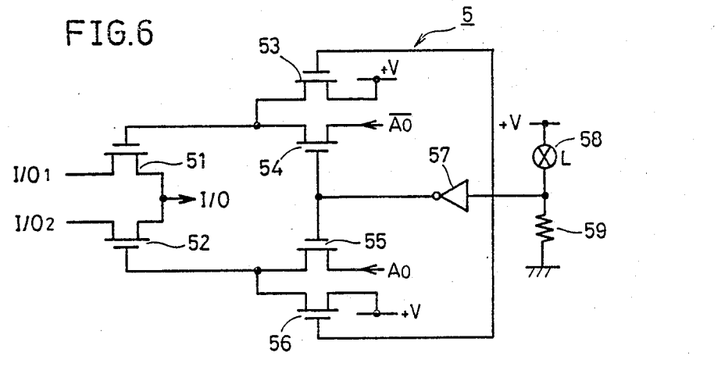
FIG. 6 is a concrete diagram of a switching circuit contained in FIGS. 4 and 5.
Figure 7:
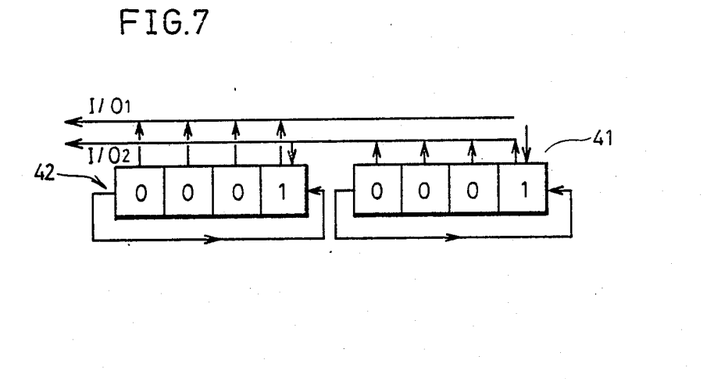
FIG. 7 is a block diagram showing one example in which a shift register is divided to vary a word length.

FIGS. 4 and 5 are block diagrams showing a shift register of one embodiment of the present invention; FIG. 6 is a concrete diagram of a switching circuit contained in FIGS. 4 and 5; and FIG. 7 is a block diagram showing one example in which a shift register is divided to vary a word length.

In the embodiments shown in FIGS. 4 and 5, a shift register 4 of eight bits is employed and the input of the initial bit of the shift register 4 is connected to the output of the last bit thereof, while the shift register 4 is divided into two groups of four bits. A data $I/O_1$ line is connected to each bit of the first half and a data $I/O_2$ line is connected to each bit of the second half. These data $I/O_1$ line and data $I/O_2$ line are connected to a common data I/O line through a switching circuit 5. The switching circuit 5 comprises two MOS transistors 51 and 52.

In the thus structured shift register 4 and switching circuit 5, when a supply voltage is applied to respective gates of the MOS transistors 51 and 52 of the switching circuit 5 to turn on the transistors simultaneously, the data $I/O_1$ line and the data $I/O_2$ line are connected to the common data I/O line. Therefore, in the example shown in FIG. 4, serial data of eight bits are inputted and outputted.

As shown in FIG. 5, when address signals $A_0$ and $\overline{A_0}$ which alternately become "H" level and "L" level, respectively, are externally applied to the MOS transistors 51 and 52 of the switching circuit 5, the data $I/O_1$ line and the data $I/O_2$ line are alternately connected to the common data line I/O line and, as a result, data is alternately accessed by four bits serially. More specifically, the first bit and the fifth bit are set to the initial data "1" and other bits are set to the initial data "0". Then, after the shift operation is carried out four times, the same state as that of initialization is obtained. More specifically, a shift register which is circulated seemingly by four-time shift operation can be provided. Although this method can be carried out by changing the connection of the shift register 4 itself as shown in FIG. 7, the method shown in FIG. 5 is far more simple in structure, by which method the entirely same operation in appearance can be carried out.

Referring to FIG. 6, a description is given of a concrete structure of the switching circuit 5. The MOS transistor 51 shown in the above described FIGS. 4 and 5 has its gate connected to respective sources of transistors 53 and 54, the MOS transistor 53 has its drain connected to a power supply line and the MOS transistor 54 receives an address signal $\overline{A_0}$ at its drain. The MOS transistor 53 has its gate connected to a node of fuse link 58 and a resistor 59.

The MOS transistor 52 has its gate connected to respective sources of MOS transistors 55 and 56, the MOS transistor 55 receives an address signal $A_0$ at its drain and the MOS transistor 56 has its drain connected to the power supply line (+V). The MOS transistor 56 has its gate connected to the node of the fuse link 58 and the resistor 59. The input of an inverter 57 is connected to this node and the output of the inverter 57 is connected to the respective gates of the MOS transistors 54 and 55.

In thus structured switching circuit 5, when the fuse link 58 is not cut off, the MOS transistors 53 and 56 are turned on because an "H" level signal is applied to each gate of the MOS transistors 53 and 56 and to the input terminal of the inverter 57. Since the output of the inverter 57 becomes "L" level, the MOS transistors 54 and 55 are turned off. Therefore, the "H" level signal is applied to the gate of the MOS transistor 51 through the MOS transistor 53 and to the gate of the MOS transistor 52 through the MOS transistor 56. As a result, the MOS transistors 51 and 52 are turned on and the data $I/O_1$ line and the data $I/O_2$ line are connected to the common data I/O line as shown in FIG. 4.

If the fuse link 58 is cut off by a method such as laser fusion, a "L" level signal is applied to each gate of the MOS transistors 53 and 56 and to the input terminal of the inverter 57, which is contrary to the above described operation. Since the output of the inverter 57 becomes "H" level, the MOS transistors 54 and 55 are turned on and the address signal $\overline{A_0}$ is applied to the gate of the MOS transistor 51 through the MOS transistor 54 and the address signal $A_0$ is applied to the gate of the MOS transistor 52 through the MOS transistor 55. As a result, MOS transistors 51 and 52 are alternately turned on and the data $I/O_1$ line and the data $I/O_2$ line are connected to the common data I/O line as shown in FIG. 5.

Figure 8:
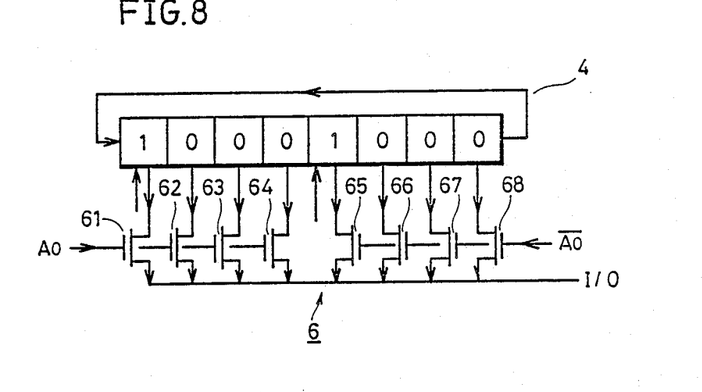
FIG. 8 is a block diagram showing a shift register and a switching circuit of another embodiment in accordance with the present invention.

FIG. 8 is a diagram showing a shift register and a switching circuit of another embodiment of the present invention.

In the embodiment shown in FIG. 8, MOS transistors 61 to 68 constructing a switching circuit 6 are connected between the output of each bit of the shift register 4 and a data I/O line. An address signal $\overline{A_0}$ is applied to all gates of the MOS transistors 61 to 64 corresponding to the bits in the first half and an address signal $A_0$ is applied to all gates of the MOS transistors 65 to 68 corresponding to four bits in the second half. The first and fifth bits are set to the initial data "1" and the other bits are set to the initial data "0" in the same manner as the description in FIG. 5. By thus structuring the shift register 4 and the switching circuit 6 and by switching the MOS transistors 61 to 64 and 65 to 68 alternately by the address signal $A_0$ and $\overline{A_0}$, data can be inputted and outputted in a four-bit word length.

Figure 9:
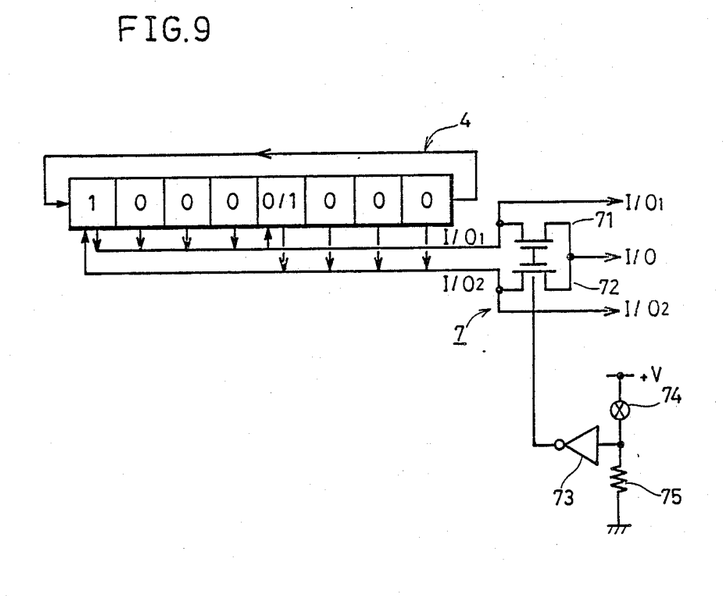
FIG. 9 is a block diagram showing still another embodiment in accordance with the present invention.

FIG. 9 is a diagram showing another embodiment of the present invention.

Although a description was given of a case in which the input/output bit width is 8 bits×1 word in the above described embodiment, in the embodiment shown in FIG. 9, the input/output bit width is switched in association with a cycle of circulation of the register between 8 bits×1 word and 4 bits×2 words. Therefore, a shift register 4 is divided into the first half 4 bits and the second half 4 bits in the same manner as the case of FIGS. 4 and 5, while the output of an inverter 73 is connected to gates of MOS transistors 71 and 72 constituting a switching circuit 7 and the input of the inverter 73 is connected to a node of a fuse link 74 and a resistance 75. When "0" is inputted to the fifth bit of the shift register 4 and the fuse link 74 is cut off, the output of the inverter 73 becomes "H" level and the MOS transistors 71 and 72 are turned on. As a result, data read from the first half 4 bits and the second half 4 bits of the shift register are outputted to the data line I/O as a 8 bits×1 word structure and when the shift register 4 makes eight shifts, data of eight bits is outputted.

If the fifth bit of the shift register 4 is set to the data "1" and the fuse link 74 is not cut off, the output of the inverter 73 becomes "L" level and the MOS transistors 71 and 72 are turned on. As a result, data outputted from the first half 4 bits and the second half 4 bits of the shift register 4 are outputted through the data I/O$_1$ line and the data I/O$_2$ line. Consequently, the structure becomes 4 bits×2 words and when the first half and the second half of the shift register 4 shift four circulation times, respectively, the register takes a round.

Use of a 4 bits×2 words structure in the embodiment shown in FIG. 9 with any parallel input/output means allows reduction in time required for testing a memory cell array. In such case, the word length may be switched by an external control signal instead of a cut-off of the fuse link.

Figure 10:
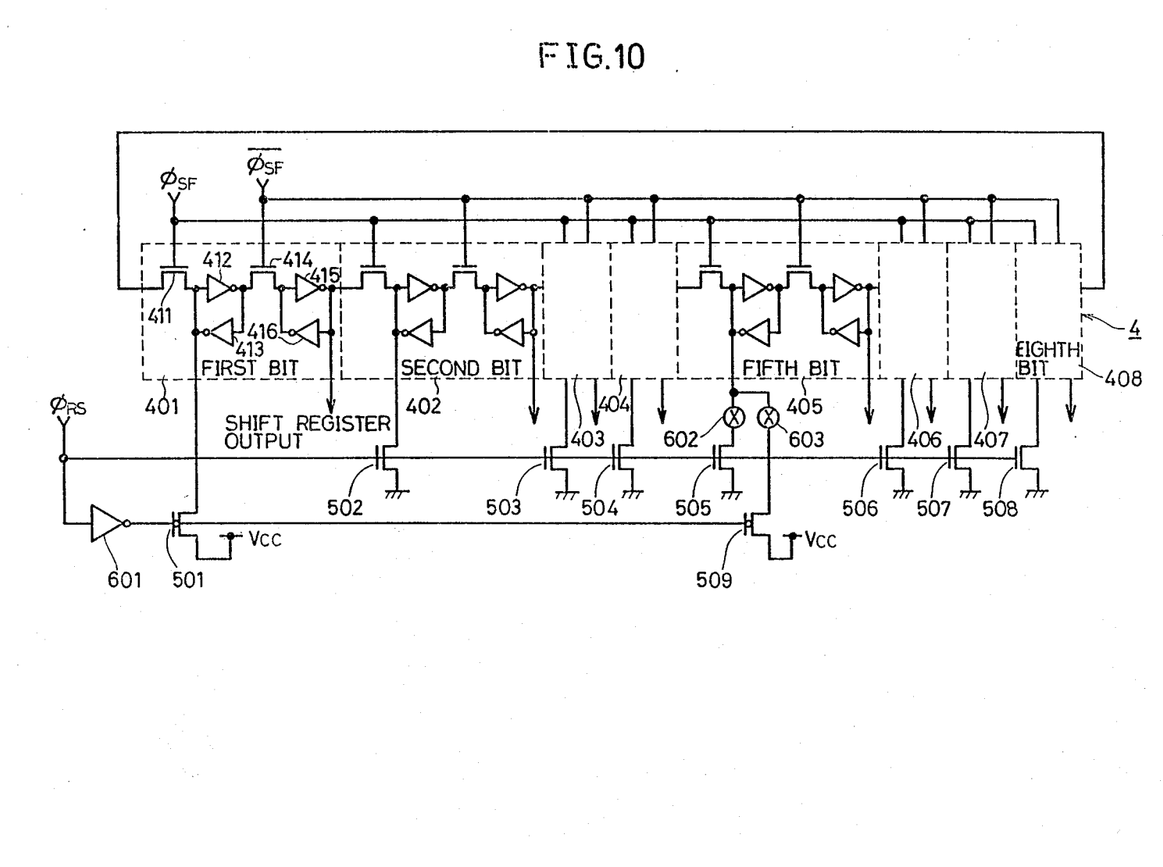
FIG. 10 is a detailed circuit diagram of still another embodiment in accordance with the present invention.

FIG. 10 is a detailed electric circuit diagram of still another embodiment of the present invention.

Referring to FIG. 10, a description is given of a structure of the embodiment. A shift register 4 comprises eight latch circuits 401 to 408 connected in cascade. The latch circuit 401 of the first stage comprises N channel MOS transistors 411 and 414 and inverters 412, 413, 415 and 416. More specifically, the transistors 411 and 414 receive at their gates clock signals $\phi_{SF}$ and $\overline{\phi_{SF}}$, respectively. The transistor 411 receives at its drain the output of the latch circuit 408 of the last stage, and its source is connected to the input of the inverter 412, the output of the inverter 413 and to the source of the P channel MOS transistor 501. The transistor 501 receives at its drain receiving a supply voltage $V_{CC}$. The transistor 414 has its drain connected to the output of the inverter 412 and the input of the inverter 413 and its source connected to the input of the inverter 415 and the output of the inverter 416. The output of the inverter 415 and the input of the inverter 416 are connected to the input of the latch circuit 402 of the next stage, and they are also outputted as the output of the first bit.

The latch circuits 402 to 408 of the second to last stages are structured in the same manner as that of the latch circuit 401 of the first stage. The latch circuits 402 to 408 are provided with corresponding N channel transistors 502 to 508, respectively and each of transistors 502 to 508 has its drain connected to each data input terminal of the latch circuits 402 to 408. The transistors 502 to 508 have their sources connected to the ground.

In addition, a fuse link 602 is connected between the drain of the transistor 505 and the data input of the latch circuit 405 and a fuse link 603 is provided in parallel to the fuse link 602. A P channel transistor 509 has its source connected to one terminal of the fuse link 603, and the supply voltage $V_{CC}$ is applied to its drain. The transistors 501 and 509 have their gates connected to the output of the inverter 601 and a clock signal $\phi_{RS}$ for initialization is applied to respective gates gate of the transistors 502 to 508 and to the input of the inverter 601. The clock signal $\phi_{RS}$ for initialization rises to "H" level only at the time of initialization of data.

A description is given of operation of the embodiment. First, when the shift register 4 is used as eight bits, the fuse link 603 is blown out. If the clock signal $\phi_{RS}$ for initialization is set to "H" level, the transistors 502 to 508 are turned on and respective drains become "L" level. Therefore, the latch circuits 402 to 408 of the second to last stages are set to the data "0".

On the other hand, the clock signal $\phi_{RS}$ for initialization of "H" level is inverted to "L" level by the inverter 601 to be applied to the gate of the transistor 501. Accordingly, the transistor 501 is turned on and a "H" level signal based on the supply voltage $V_{CC}$ applied to the drain of the transistor 501 is applied to the latch circuit 401 of the first stage from the source. As a result, initial data of "10000000" is set in the shift register 4.

The transistors 411 and 414 are turned on successively in accordance with the clock signal $\phi_{SF}$ and $\overline{\phi_{SF}}$ and the initial data "1" set by a latch circuit comprising the transistors 411 and 414 is latched by a latch circuit comprising the inverters 415 and 416 through the transistor 414 to be shifted to the latch circuit 402 of the next stage.

When the shift register 4 is used as two circuits each comprising four bits, the fuse link 602 is blown off, while the fuse link 603 is left as it is. When the clock signal $\phi_{RS}$ for initialization is set to "H" level, the transistors 502 to 504 and 506 to 508 are turned on and latch circuits 402 to 404 and 406 to 408 of the second to fourth and the sixth to eighth stages are set to the initial data "0".

On the other hand, the clock signal $\phi_{RS}$ for initialization of "H" level is inverted to "L" level by the inverter 601, and the transistors 501 and 509 are turned on. As a result, the latch circuit 401 of the first stage and the latch circuit 405 of the fifth stage are set to the initial data "1". Initialized data set in each group by the clock signals $\phi_{SF}$ and $\overline{\phi_{SF}}$ is shifted in order.

Although a description was given of a case in which a word length is eight bits or four bits in the embodiments described above, the circuit of the present invention may be employed in the case in which a word length is varied by three or more stages.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A variable word length circuit of a semiconductor memory for varying a word length of a memory cell array in which a plurality of memory cells are arranged in row and column directions, comprising:

a shift register with stages corresponding to respective bits of said memory cell array, said shift register having a fixed recirculation path with an input of a first stage of the register being connected to an output of the last stage of the register, for selecting a memory cell from among said plurality of cells by circulating successively data stored in said shift register along a path including said fixed circulation path;

means for varying a word length of data accessed from said memory cell array by changing data stored in the stages of said shift register; and means responsive to said word length varying means for switching an output of said shift register.

2. A variable word length circuit of a semiconductor memory in accordance with claim 1, wherein said shift register comprises data input terminals which are provided corresponding to respective stages, and said switching means comprises switching devices applying initialization data to each of said data input terminals of said shift register or applying the same to each group of a plurality of grouped stages of said shift register.

3. A word length variable circuit of a semiconductor memory in accordance with claim 2, wherein said switching device comprises:

first switching transistors provided corresponding to respective stages except for the lead stage of said shift register; and a second switching means provided corresponding to each lead stage of said grouped stages.

4. A word length variable circuit of a semiconductor memory in accordance with claim 3, wherein, said second switching means comprises third and fourth transistors corresponding to the lead stage of the group of the next stage of said grouped stages; and further comprising:

means for enabling either one of the third or fourth switching transistors and disabling the other.

5. A word length variable circuit of a semiconductor memory in accordance with claim 2, wherein said shift register comprises data output terminals provided corresponding to respective stages; and output switching means for switching data outputted from said each stage so that the data may be outputted at said each group or outputted together.

6. A word length variable circuit of a semiconductor memory in accordance with claim 5, wherein said output switching means comprises fifth switching transistors each having a gate and first and second conducting terminals, said first conducting terminal being connected to the respective output terminals contained in said each group, and being turned on together or separately in accordance with a signal applied to said gate to output data from respective second conducting terminals or to output data at every group.

7. A word length variable circuit of a semiconductor memory in accordance with claim 5, wherein said output switching means comprises sixth switching transistors each having a gate and first and second conducting terminals and being provided corresponding to each stage; and each of said fourth switching transistors has the first conducting terminal connected to the data output terminal of each stage of said shift register, outputs data outputted from each of said data output terminals to said second conducting terminal when said second conducting terminal is connected in common and a common control signal is applied to each gate, and outputs data outputted from each of said groups from said second conducting terminal when a control signal is applied to the gate of each of the sixth switching transistors corresponding to the grouped stages.

8. A method of varying a word length of a semiconductor memory cell array wherein memory cells are arranged in row and column directions, wherein a shift register having stages corresponding to respective bits of a row or a column of said memory cell array is provided for selecting a memory cell from among said plurality of cells, said shift register having a fixed recirculation path formed by an interconnection between an input of a first stage of the register and an output of the last stage of the register, comprising the steps of changing data stored in the stages of said shift register to correspond to a predetermined word length; and recirculating said shift register along a path including said fixed recirculation path.

9. The method of claim 8, wherein said data stored in the stages of said shift register are changed to vary said word length by initializing respective stages of said register.

* * * * *